(12) United States Patent
Pant et al.

(10) Patent No.: US 9,473,113 B1
(45) Date of Patent: Oct. 18, 2016

(54) POWER MANAGEMENT WITH FLIP-FLOPS

(71) Applicant: QUALCOMM Incorporated, San Diego, CA (US)

(72) Inventors: Harshat Pant, San Diego, CA (US); Ramaprasath Vilangudipitchai, San Diego, CA (US); Divjyot Bhan, Encinitas, CA (US); Lipeng Cao, La Jolla, CA (US); Sai Pradeep Kochuri, San Diego, CA (US); Parissa Najdesamii, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/864,101

(22) Filed: Sep. 24, 2015

(51) Int. Cl.
  *H03K 3/02* (2006.01)
  *H03K 3/012* (2006.01)
  *H03K 3/037* (2006.01)

(52) U.S. Cl.
  CPC ............ *H03K 3/012* (2013.01); *H03K 3/0372* (2013.01)

(58) Field of Classification Search
  CPC ...................................................... H03K 3/012
  See application file for complete search history.

(56) References Cited

U.S. PATENT DOCUMENTS

| | | | |
|---|---|---|---|
| 7,548,103 B2 | 6/2009 | Ramaraju et al. | |
| 8,044,695 B2 | 10/2011 | Miyazaki | |
| 8,381,163 B2 | 2/2013 | Schreiber et al. | |
| 8,841,952 B1 | 9/2014 | Singh et al. | |
| 8,854,077 B2 | 10/2014 | Hoberman et al. | |
| 2012/0131526 A1* | 5/2012 | Schreiber ............. | H03K 3/0375 716/110 |

* cited by examiner

*Primary Examiner* — Daniel Puentes
(74) *Attorney, Agent, or Firm* — Arent Fox LLP

(57) ABSTRACT

An integrated circuit (IC) is disclosed herein for managing power with flip-flops having a retention feature. In an example aspect, an IC includes a constant power rail, a collapsible power rail, multiple flip-flops, and power management circuitry. Each flip-flop of the multiple flip-flops includes a master portion that is coupled to the collapsible power rail and a slave portion that is coupled to the constant power rail. The power management circuitry is configured to combine a clock signal and a retention signal into a combined control signal and to provide the combined control signal to each flip-flop of the multiple flip-flops.

29 Claims, 10 Drawing Sheets

POWER MANAGEMENT WITH FLIP-FLOPS

BACKGROUND

1. Field of the Disclosure

This disclosure relates generally to power management with flip-flops that are deployed in an integrated circuit (IC) and, more specifically, to controlling multiple flip-flops with each flip-flop having a retention feature including a live slave portion and a collapsible master portion.

2. Description of Related Art

Power consumption of electronic devices is an increasingly important factor in electronic device design. From a global perspective, energy demands of electronic devices occupy a sizable percentage of total energy usage due to large corporate data centers and the ubiquity of personal computing devices. Environmental concerns thus motivate efforts to lower the power consumption of electronic devices to help conserve the earth's resources. From an individual perspective, in addition to a universal desire to have lower energy bills, many personal computing devices are powered by batteries. The less energy that is consumed by a portable battery-powered electronic device, the longer the portable device may operate without recharging the battery. Lower energy consumption also enables the use of smaller batteries and the adoption of thinner form factors to make devices that are more portable. Therefore, the popularity of portable electronic devices also motivates efforts to lower the power consumption of electronic devices.

An electronic device consumes power if the device is coupled to a power source and is turned on. Although this power consumption scenario is true for the entire electronic device, the consumption scenario is also true for individual parts of the electronic device. Hence, power may be conserved if parts of an electronic device are decoupled from power or turned off even while other parts remain powered and turned on. Entire discrete components of an electronic device, such as a whole integrated circuit (IC) or a display screen, may be decoupled from power or turned off. Selected parts of a discrete component may likewise be powered down. For example, an integrated circuit processing entity, such as a core of an integrated circuit, may be powered down. Parts of an integrated circuit may be powered down intermittently if usage is regular but discontinuous, or may be powered down temporarily if usage has ceased for some arbitrary period of time.

Powering down part of an integrated circuit, such as a core, can save power and extend battery life. Unfortunately, powering down a core of an integrated circuit can also create problems. For example, resuming operations with a powered down core takes time, which can slow performance and adversely impact a user experience. Furthermore, operational data may be lost if power is removed from certain types of computer memory. Losing operational data may force an application to restart or permanently damage user files, such as documents or pictures. To avoid a loss of operational data, the operational data may be moved to a slower or remote memory location prior to a core of an integrated circuit being powered down. When a time to awaken the core to continue a computing task arrives, the operational data is retrieved from the memory location for further processing, but this retrieval operation delays the resumption of computing functionality from the powered down state.

SUMMARY

In an example aspect, an integrated circuit is disclosed. The integrated circuit includes a constant power rail, a collapsible power rail, multiple flip-flops, and power management circuitry. Each flip-flop of the multiple flip-flops includes a master portion coupled to the collapsible power rail and a slave portion coupled to the constant power rail. The power management circuitry is configured to combine a clock signal and a retention signal into a combined control signal and to provide the combined control signal to each flip-flop of the multiple flip-flops.

In an example aspect, an integrated circuit is disclosed. The integrated circuit includes a constant power rail, a collapsible power rail, and multiple flip-flops. The collapsible power rail is configured to be decoupled from power while the collapsible power rail is collapsed. Each flip-flop of the multiple flip-flops includes a master portion coupled to the collapsible power rail and a slave portion configured to store slave data and coupled to the constant power rail. The integrated circuit also includes means for generating a combined control signal based on a clock signal and a retention signal such that the combined control signal is clamped at a constant value while the retention signal is active and such that the combined control signal is periodic having a period of the clock signal while the retention signal is not active. The integrated circuit further includes circuitry configured to distribute the combined control signal to each flip-flop of the multiple flip-flops.

In an example aspect, a method for power management of flip-flops is disclosed. The method includes powering each master portion of multiple flip-flops with a collapsible power rail and powering each slave portion of the multiple flip-flops with a constant power rail. The method also includes combining a clock signal and a retention signal to produce a combined control signal. The method further includes providing the combined control signal to the multiple flip-flops to retain slave data of each slave portion of the multiple flip-flops during a power collapse of the collapsible power rail.

In an example aspect, an integrated circuit is disclosed. The integrated circuit includes a first flip-flop, a second flip-flop, and power management circuitry. The first flip-flop includes a master portion and a slave portion, with the master portion configured to undergo a power collapse and the slave portion configured to retain slave data during the power collapse. The second flip-flop also includes a master portion and a slave portion, with the master portion configured to undergo the power collapse and the slave portion configured to retain slave data during the power collapse. The power management circuitry is configured to produce a combined control signal based on a clock signal and a retention signal. The power management circuitry is further configured to provide the combined control signal to the first flip-flop and to the second flip-flop, with the combined control signal having a value configured to cause the slave portion of the first flip-flop and the slave portion of the second flip-flop to retain the slave data during the power collapse.

DETAILED DESCRIPTION

Figure 1:
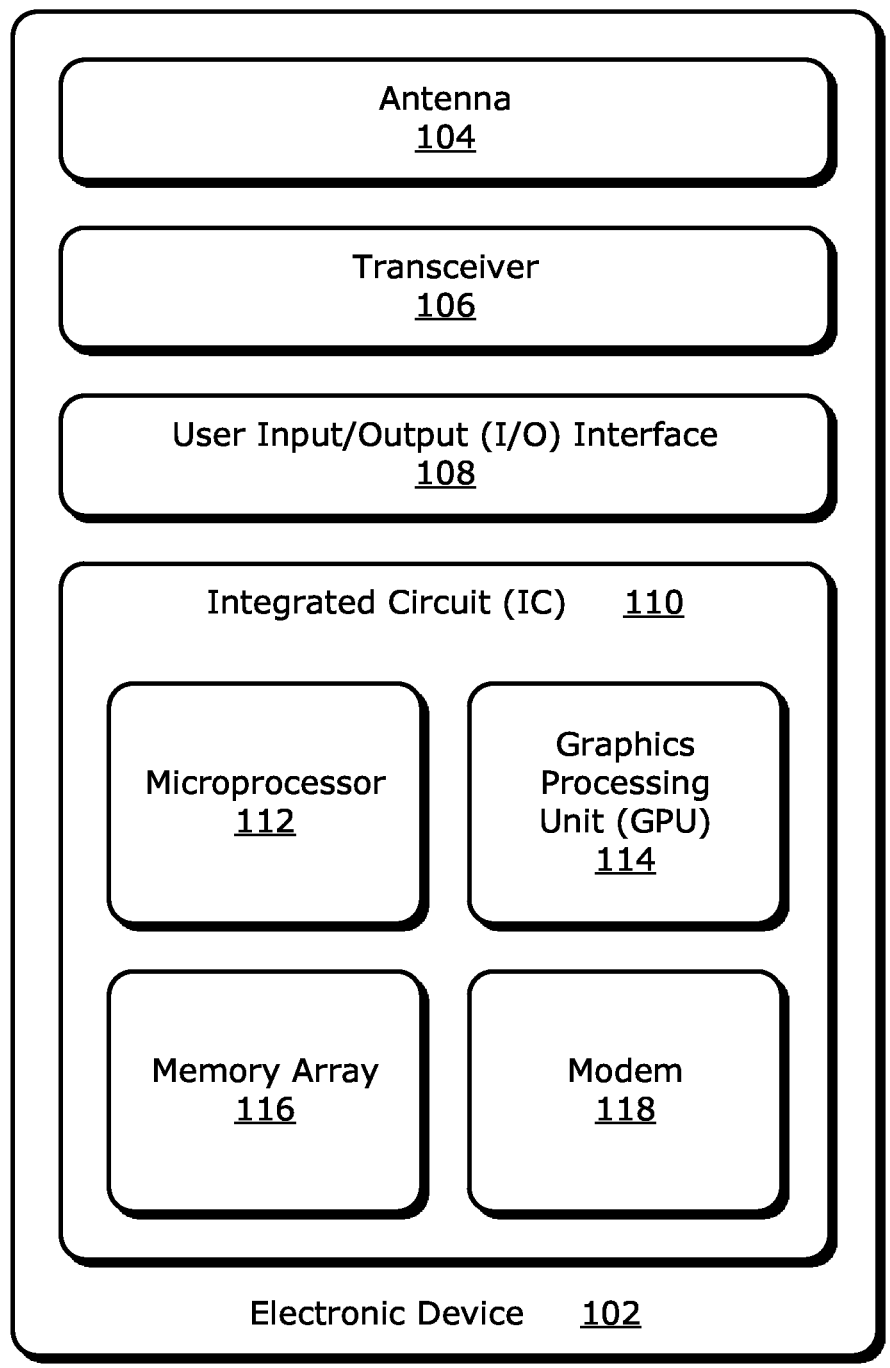
FIG. 1 depicts an example electronic device that includes an integrated circuit (IC).

During times of complete non-use, an entire integrated circuit (IC) may be powered down to reduce energy consumption. Powering down at least part of an integrated circuit is called "power collapse." At other times, however, selected parts of an integrated circuit, such as one or more cores, may be used for processing, storing, or communicating while other cores are idle. If an integrated circuit cannot be powered down as a whole, one or more cores may be powered down independently of other cores. For example, if an integrated circuit is waiting for additional data or user input before changing what is displayed on a screen, a graphics processing unit (GPU) core may be powered down. A modem that is idle may be powered down between incoming or outgoing communications. Also, if half of a memory is unused, the unused memory half may be powered down while the other half remains powered.

A core of an integrated circuit may include many flip-flops. A flip-flop (FF), which may also be simply called a flop, is a unit of computing memory that stores one bit of operational data. A flip-flop may include a master portion and a slave portion in which data is transferred internally from the master portion to the slave portion. Clocked flip-flops are configured such that data stored in the master portion is transferred to the slave portion responsive to pulses of a clock signal.

Flip-flops are relatively fast memory units and are used quite frequently. Flip-flops are also volatile memory that relinquish stored data if powered down, such as through a power collapse of a corresponding integrated circuit that includes the flip-flops. Accordingly, power management techniques can be utilized to carefully manage cores that include flip-flops. To prevent loss of the data that is stored in the flip-flops of a core undergoing power collapse, the stored data may be moved to non-volatile memory that retains data without power, or to another core that is not being powered down. The relocated data is then returned to the flip-flops after the core is powered up again. However, this approach takes time and is resource intensive for the integrated circuit in terms of occupied chip area and signal routing congestion.

Some flip-flops include a retention feature that renders the flip-flop capable of retaining data during a power collapse of a corresponding core. Such a flip-flop is termed a retention flip-flop (RFF). A retention flip-flop may be realized as a flip-flop having an additional associated latch and two level shifters. The additional latch is referred to as a balloon or shadow latch. The balloon latch is adapted to store data for a slave portion of the flip-flop as a master portion and the slave portion undergo power collapse. After the power collapse, the balloon latch returns the data to the slave portion of the flip-flop. However, retention flip-flops with balloon latches are large, occupying as much as three times the area of a standard flip-flop with no retention feature. A retention flip-flop may also be realized as a flip-flop in which a master portion and a slave portion are both coupled to a constant power rail of a core. The constant power rail continues to provide power to the retention flip-flop during power collapse. Other circuitry that is coupled instead to a collapsible power rail loses power as a corresponding core undergoes power collapse.

Although the latter approach results in a retention flip-flop that is smaller than the former approach employing the balloon latch, both the master portion and the slave portion remain powered during a power collapse event in accordance with the latter approach. Power savings may be achieved over this latter approach if one of the master portion or the slave portion were to undergo power collapse while the other portion remains powered. Resumption of computing activity may be achieved using operational data that is safely stored in, for example, the slave portion of the flip-flop without relying on data that is stored in the master portion. Hence, the master portion may undergo power collapse while the slave portion continues to be powered.

Unfortunately, simply coupling the master portion to a collapsible power rail and permitting the master portion to undergo power collapse is problematic. If the master portion undergoes power collapse, a voltage signal value for data of the master portion is indeterminate as the voltage level degrades toward ground. If the voltage level for the master data degrades during a power collapse, the degraded voltage level may infect the corresponding slave portion that remains powered by propagating to the slave portion during or as a result of the power collapse. Consequently, voltage signal values for data stored by the powered slave portion may be corrupted and changed to an unknown state. The corrupted data is then detrimentally used for computing tasks that are resumed after the power collapse ends. However, a degraded voltage level may be quarantined within the master portion, or at least apart from the slave portion, if isolation between the master portion and the slave portion is correctly maintained during a power collapse.

One or more embodiments enable a slave portion of a flip-flop having a retention feature to be isolated from a master portion of the flip-flop during a power collapse so that slave data of the slave portion is retained while the master portion undergoes power collapse. The master portion and the slave portion are coupled to different power rails. Specifically, the master portion is coupled to a collapsible power rail, and the slave portion is coupled to a constant power rail. Isolation circuitry isolates the slave portion from the master portion responsive to an active retention signal in conjunction with a clampable clock signal.

In this manner, a flip-flop is provided with a retention feature in which slave data of a slave portion of the flip-flop is retained while a master portion of the flip-flop is permitted to undergo power collapse. This retention feature may be enabled using isolation circuitry that isolates the master data from the slave data if the isolation circuitry is placed in a correct state or condition to establish a quarantine of the master data during a retention period.

Thus, isolation control functionality maintains the isolation circuitry in a correct state to quarantine the master data during a power collapse event. In one approach, an isolation control may be located within each flip-flop. Unfortunately, having a separate, individual isolation control for each isolation circuitry inside each flip-flop creates a significant overhead area penalty on an integrated circuit chip. Furthermore, a separate individual line for the clock signal and a separate individual line for the retention signal are both routed to each flip-flop with such an approach. In an alternative approach, multiple isolation circuitries, which isolate respective master portions from respective slave portions, for respective ones of multiple flip-flops may be jointly controlled by shared power management circuitry that is located external to the multiple flip-flops.

One or more embodiments enable multiple flip-flops having a retention feature to share power management circuitry that is external of each of the multiple flip-flops, such as at a clock tree for the integrated circuit. The shared power management circuitry controls isolation circuitry that is internal of the multiple flip-flops. The power management circuitry combines a clock signal and a retention signal to produce a combined control signal. The power management circuitry provides the combined control signal to the multiple flip-flops to cause the isolation circuitry of each flip-flop to isolate master portions from corresponding slave portions of the multiple flip-flops. The combined control signal is routed to each of the multiple flip-flops from the power management circuitry instead of using separate individual lines for the clock signal and the retention signal. Thus, signal routing between the shared power management circuitry and the multiple retention flip-flops may be reduced by approximately 50%.

In this manner, flip-flops are provided that include a retention feature controlled by external power management circuitry that is shared by multiple flip-flops to save area on an integrated circuit chip. The slave portions of the flip-flops can therefore be isolated from the corresponding master portions without including circuit devices for isolation control in individual ones of the flip-flops and without having increased congestion from multiple wire traces used for control signaling of a retention mode for power collapse.

In an example structure, an integrated circuit includes a collapsible power rail, a constant power rail, multiple flip-flops, and power management circuitry. Each flip-flop of the multiple flip-flops includes a master portion, a slave portion, and isolation circuitry. The isolation circuitry may be part of the master portion or the slave portion of a flip-flop or separate from both portions. In operation, the power management circuitry, which is external of the multiple flip-flops, produces a combined control signal based on a clock signal and a retention signal. The combined control signal may be provided using a single signal line to the isolation circuitry to isolate each slave portion from each corresponding master portion of the multiple flip-flops during a power collapse. The isolation keeps slave data of the slave portion protected from being changed by the effects of the power collapse on the master portion.

By way of example only, power management circuitry that is external of the multiple flip-flops may be configured to clamp the clock signal responsive to the retention signal to at least partially isolate the multiple flip-flops from a change to the clock signal that can occur due to the power collapse. Similarly, reset circuitry may be configured to clamp a reset signal responsive to the retention signal to at least partially isolate the multiple flip-flops from a change to the reset signal that can occur due to the power collapse. Analogously, set circuitry may be configured to clamp a set signal responsive to the retention signal to at least partially isolate the multiple flip-flops from a change to the set signal that can occur due to the power collapse. The reset circuitry and the set circuitry may likewise be located external to the multiple flip-flops and shared by the multiple flip-flops to save chip area and reduce wire trace congestion.

FIG. 1 depicts an example electronic device 102 that includes an integrated circuit (IC) 110. As shown, the electronic device 102 includes an antenna 104, a transceiver 106, and a user input/output (I/O) interface 108 in addition to the IC 110. Illustrated examples of the IC 110 include a microprocessor 112, a graphics processing unit (GPU) 114, a memory array 116, and a modem 118.

The electronic device 102 may be a mobile or battery-powered device or a fixed device that is designed to be powered by an electrical grid during operation. Examples of an electronic device 102 include a server computer, a network switch or router, a blade of a data center, a personal computer, a desktop computer, a notebook computer, a tablet computer, a smartphone, an entertainment appliance, or a wearable computing device such as a smartwatch, intelligent glasses, or an article of clothing. An electronic device 102 may also be a device, or a portion thereof, having embedded electronics. Examples of an electronic device 102 with embedded electronics include a passenger vehicle, industrial equipment, a refrigerator or other home appliance, a drone or other unmanned aerial vehicle (UAV), or a power tool.

For an electronic device with a wireless capability, the electronic device 102 includes an antenna 104 that is coupled to a transceiver 106 to enable reception or transmission of one or more wireless signals. The IC 110 may be coupled to the transceiver 106 to enable the IC 110 to have access to received wireless signals or to provide wireless signals for transmission via the antenna 104. The electronic device 102 as shown also includes at least one user I/O interface 108. Examples of a user I/O interface 108 include a keyboard, a mouse, a microphone, a touch-sensitive screen, a camera, an accelerometer, a haptic mechanism, a speaker, a display screen, and a projector.

The IC 110 may comprise, for example, one or more instances of a microprocessor 112, a GPU 114, a memory array 116, a modem 118, and so forth. The microprocessor 112 may function as a central processing unit (CPU) or other general-purpose processor. Some microprocessors include different parts, such as multiple processing cores, that may be individually powered on or off. The GPU 114 may be especially adapted to process visual-related data to be displayed for a person. If visual-related data is not being processed or rendered, the GPU 114 may be powered down. The memory array 116 stores data for the microprocessor 112, the GPU 114, or user files. Example types of memory for the memory array 116 include random access memory (RAM), such as dynamic RAM (DRAM) or static RAM (SRAM), flash memory, and so forth. If programs are not accessing data stored in memory, the memory array 116 may be powered down. The modem 118 modulates a signal to encode information into the signal or demodulates a signal to extract encoded information. If there is no information to encode or decode for outbound or inbound communications, the modem 118 may be idled to reduce power consumption. The IC 110 may include additional or alternative parts than those that are shown, such as an I/O interface, a transceiver or another part of a receiver chain, a customized or hard-coded processor such as an application-specific integrated circuit (ASIC), a sensor such as an accelerometer, and so forth.

The IC 110 may also comprise a system on a chip (SOC). An SOC may integrate a sufficient number or type of components to enable the SOC to provide computational functionality as a notebook, a mobile phone, or another electronic apparatus using exclusively or primarily one chip. Components of an SOC, or an IC 110 generally, may be termed blocks or cores. Examples of cores or circuitry blocks include a voltage regulator, a memory array, a memory controller, a general-purpose processor, a cryptographic processor, a modem, a vector processor, an I/O interface or communication controller, a wireless controller, and a GPU. Any of these cores or circuitry blocks, such as a processor or GPU core, may further include multiple internal cores. A core of an SOC may be powered down if not in use according to the techniques described in this document.

Figure 2:
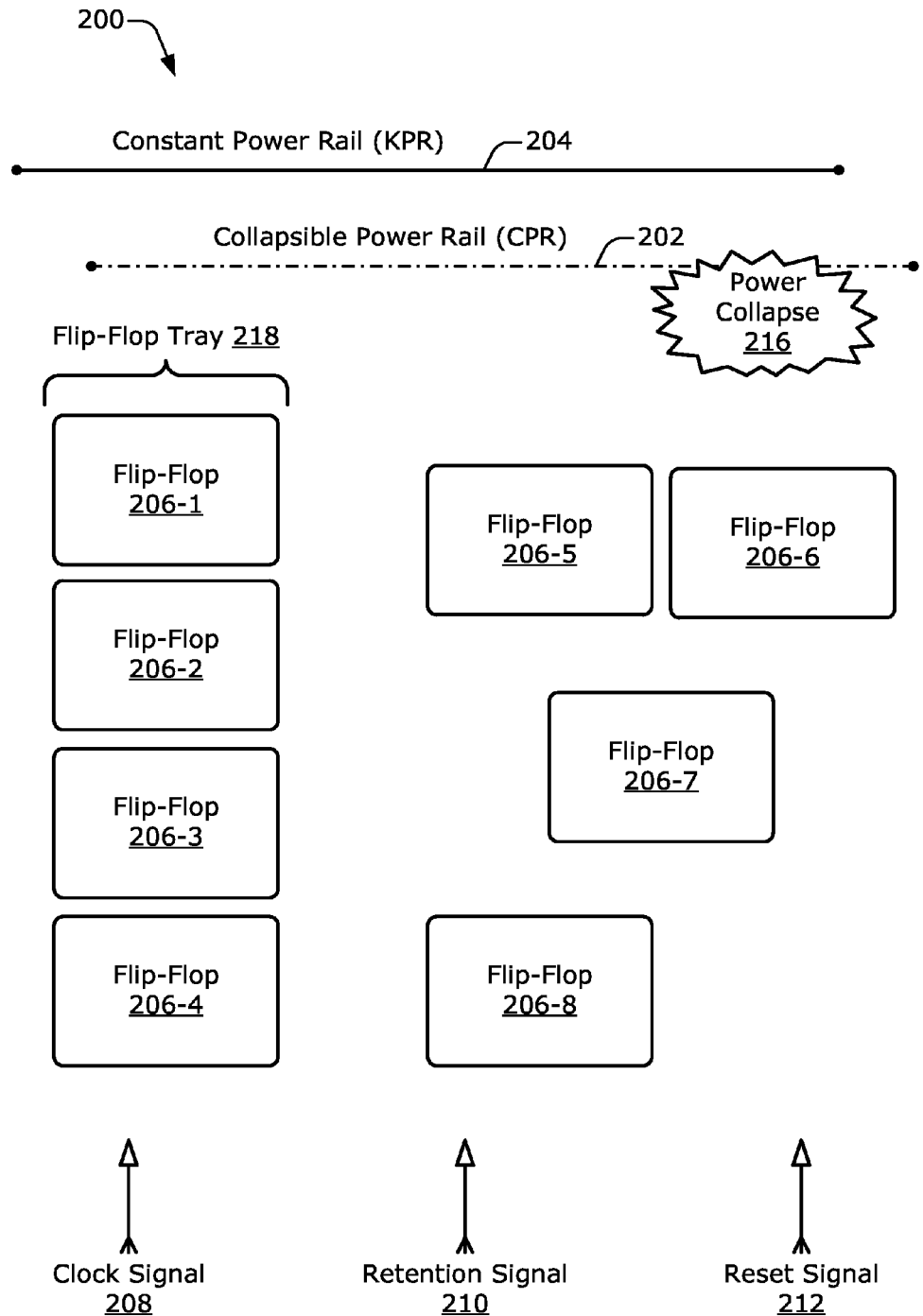
FIG. 2 depicts an example IC portion that includes two power rails, multiple flip-flops, and different types of signals.

FIG. 2 depicts an example IC portion 200 that includes multiple flip-flops 206-1 to 206-8 and which utilizes different types of signals. As illustrated, the IC portion 200 includes a collapsible power rail 202 (CPR), a constant power rail 204 (KPR), eight flip-flops 206-1 to 206-8, and a flip-flop tray 218 that includes a subset of the flip-flops. The IC portion 200 further includes or otherwise makes use of a clock signal 208, a retention signal 210, and a reset signal 212. The IC portion 200 also experiences a power collapse 216. Flip-flops are distributed around the IC portion 200 at various locations at which data is to be stored for different processing tasks.

A flip-flop may be disposed on the IC portion 200 alone, such as flip-flop 206-7 or flip-flop 206-8. Flip-flops may alternatively be disposed together, such as flip-flop 206-5 being disposed proximate to flip-flop 206-6. Flip-flops may also be disposed in an operational group, with a flip-flop operational group being termed a flip-flop tray or simply a flop tray. A flip-flop tray may share circuitry or control signaling among multiple flip-flops, such as circuitry that enables scan testing of an IC. A total number of flip-flops in a flip-flop tray may be 2, 4, 8, 10, 16, 17, 32, and so forth. As shown, the flip-flop tray 218 includes flip-flop 206-1, flip-flop 206-2, flip-flop 206-3, and flip-flop 206-4.

For one or more embodiments, the collapsible power rail 202 and the constant power rail 204 are held at a given voltage and powered by a power management IC (PMIC), which is not shown. The PMIC may be internal to or external of the same IC as that of the IC portion 200. The PMIC is configured to supply steady voltages to power rails at particular voltage levels through voltage conversion or voltage regulation. The constant power rail 204 is configured to maintain power during normal operation. The collapsible power rail 202, on the other hand, is configured to be decoupled from power during normal operation to facilitate a power collapse event. If power is removed from the collapsible power rail 202, circuitry that is coupled to the collapsible power rail 202 undergoes a power collapse event, which is represented by power collapse 216.

More specifically, the collapsible power rail 202 may undergo a power collapse 216 if the collapsible power rail 202 is disconnected from a power source. The disconnection may be effectuated internally or externally using a switch that is coupled between the power source and the collapsible power rail 202 or by turning off the power source. If the collapsible power rail 202 is disconnected from a power source, the voltage on the collapsible power rail 202 begins to drop and eventually reaches a ground potential. For the sake of clarity and to distinguish one power rail from the other, the power rail 204 is called the constant power rail 204. However, the constant power rail 204 is collapsible. For example, if a device containing the IC portion 200 is completely powered down, the constant power rail 204 undergoes a power collapse. Additionally, from time to time, an alternative power management scenario may involve collapsing both the collapsible power rail 202 and the constant power rail 204.

In this particular example, three control signals are represented near the bottom of FIG. 2 as arrows. With regard to flip-flop operation, the clock signal 208 advances data from an input of a flip-flop, across master and slave portions of the flip-flop, which are not explicitly shown in FIG. 2, to an output of the flip-flop. A retention signal 210 is driven active or placed in an active state to cause data to be retained during the power collapse 216. An active retention signal 210 activates corresponding retention features of retention flip-flops. A flip-flop, including a retention flip-flop, may comprise a reset or resettable flip-flop. An active reset signal 212 causes flip-flops having a reset feature to be reset to a known state, such as zero (0) or one (1). Hence, if a reset signal 212 is active and applied to a reset flip-flop, the reset flip-flop generates a known output of zero or one, depending on the internal architecture of the flip-flop. A reset flip-flop may be responsive to a reset signal 212 that is active high or active low, as is described with reference to FIGS. 8 and 9.

Flip-flops that are clocked operate based at least partially on the clock signal 208. Retention flip-flops operate based at least partially on the retention signal 210. A reset flip-flop operates based at least partially on the reset signal 212. One or more combined or clampable control signals are routed to each of the multiple flip-flops 206-1 to 206-8 or control devices thereof, which are not explicitly illustrated in FIG. 2, to enable appropriate flip-flop functionality. By sharing control circuitry or control signaling, efficiency may be increased in terms of power consumption or on-chip resource utilization. Embodiments are described herein that lower power consumption, reduce the chip area occupied by the power management circuitry for a given number of retention flip-flops, or decrease the complexity and congestion of wire traces that route control signals for power management of multiple flip-flops.

Figure 3:
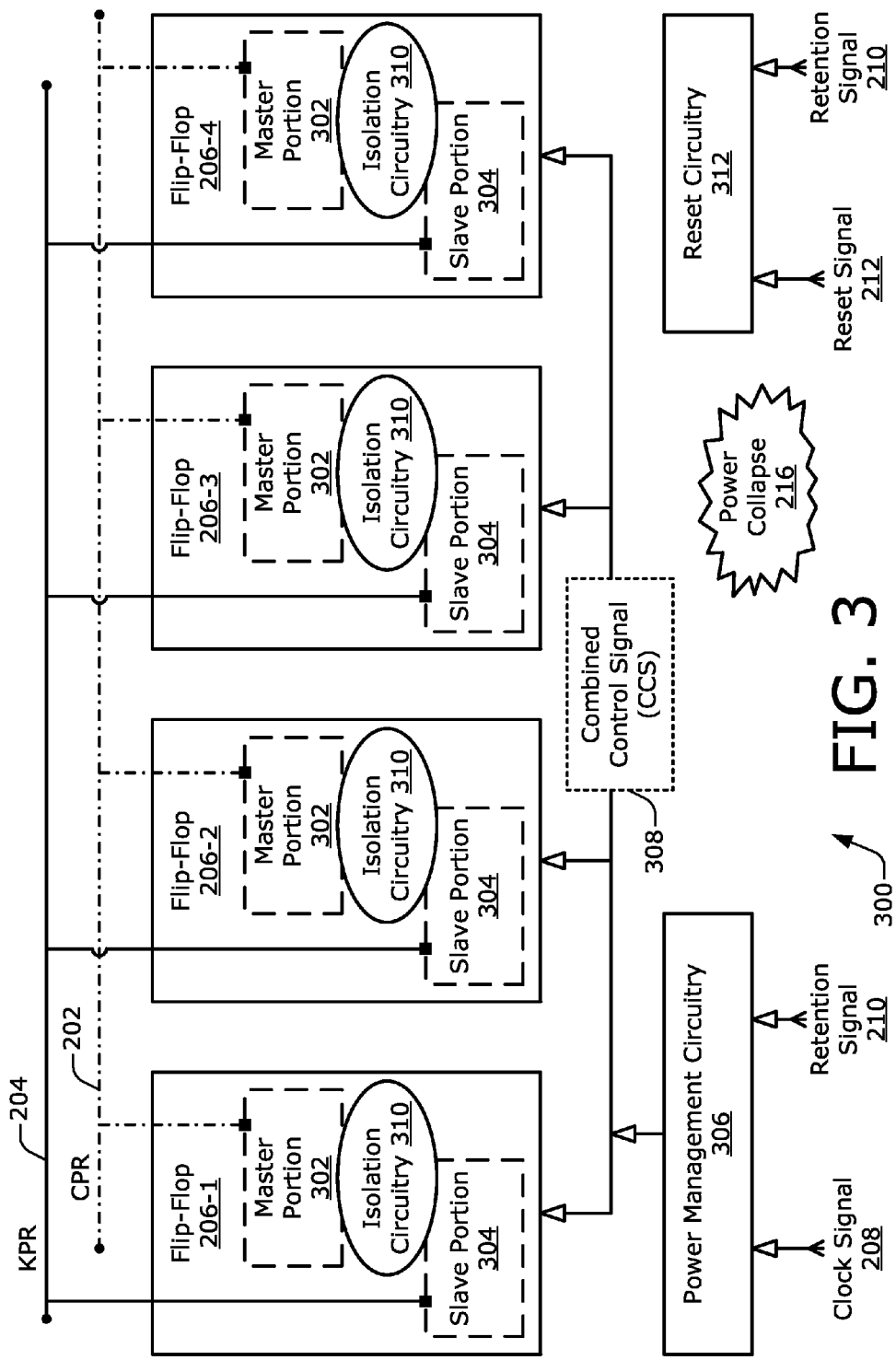
FIG. 3 depicts an example retention control arrangement for multiple flip-flops with power management circuitry in a power collapse environment.

FIG. 3 depicts an example retention control arrangement 300 for multiple flip-flops 206-1 to 206-4 and power management circuitry 306 in an environment in which a power collapse 216 can occur. As illustrated, retention control arrangement 300 includes the collapsible power rail 202, the constant power rail 204, the multiple flip-flops 206-1 to 206-4, the power management circuitry 306, and reset circuitry 312. Retention control arrangement 300 further includes various control signals: the clock signal 208, the retention signal 210, the reset signal 212, and a combined control signal 308 (CCS). Each flip-flop 206 of the multiple flip-flops 206-1 to 206-4 includes a master portion 302, a slave portion 304, and isolation circuitry 310.

For one or more embodiments, the master portion 302 of each flip-flop 206 is powered by a different power rail than the slave portion 304. In this particular example, the master portion 302 is coupled to, and powered by, the collapsible power rail 202. The slave portion 304 is coupled to, and powered by, the constant power rail 204. The power management circuitry 306 is configured to combine a clock signal 208 and a retention signal 210 into the combined control signal 308. The power management circuitry 306 is also configured to provide the combined control signal 308 to each flip-flop 206 of the multiple flip-flops 206-1 to 206-4. For an example implementation, the power management circuitry 306 provides means for generating the combined control signal 308 based on the clock signal 208 and the retention signal 210.

The power management circuitry 306 is configured to provide the combined control signal 308 to each flip-flop 206 of the multiple flip-flops 206-1 to 206-4 during the power collapse 216. Doing so isolates the slave portion 304 from the master portion 302 of each flip-flop 206 using the isolation circuitry 310. For an example implementation, the isolation circuitry 310 provides means for isolating the slave portion 304 from the master portion 302 of each flip-flop 206. More specifically, responsive to receiving the combined control signal 308, each flip-flop 206 of the multiple flip-flops 206-1 to 206-4 is configured to isolate the master portion 302 from the slave portion 304 to retain slave data at an output of the slave portion 304 during the power collapse 216, as is described in more detail below. Retention of this slave data is described herein with particular reference to FIGS. 4-6. In at least some embodiments, responsive to a state of the retention signal 210, the power management circuitry 306 is configured to clamp the combined control signal 308 at a constant value, such as zero or one, during the power collapse 216. The clamping may be performed responsive to an active state, such as an asserted state or a high voltage level, of the retention signal 210. Further description of generating and maintaining the combined control signal 308 is provided herein with particular reference to FIGS. 5 and 6.

Retention control arrangement 300 also includes the reset signal 212 and the reset circuitry 312. As illustrated in FIG. 3, the reset circuitry 312 may also receive the retention signal 210. The reset circuitry 312 combines the retention signal 210 and the reset signal 212. An output (not shown in FIG. 3) of the reset circuitry 312 may at least partially control operation of the multiple flip-flops 206-1 to 206-4 to prevent an occurrence of an unintentional reset operation during the power collapse 216. Example aspects of the reset circuitry 312 are described further herein with particular reference to FIGS. 8 and 9.

Although certain principles of flip-flop power management are described herein with reference to the multiple flip-flops 206-1 to 206-4 of FIG. 3, the principles are neither limited to any particular number of flip-flops nor to multiple flip-flops that form a flip-flop tray, such as the flip-flop tray 218 of FIG. 2. Also, the isolation circuitry 310 of each flip-flop 206 is illustrated in FIG. 3 separately from the master portion 302 and the slave portion 304 as an example only. The isolation circuitry 310, or one or more circuit devices thereof, may alternatively be part of the master portion 302 or the slave portion 304.

Figure 4:
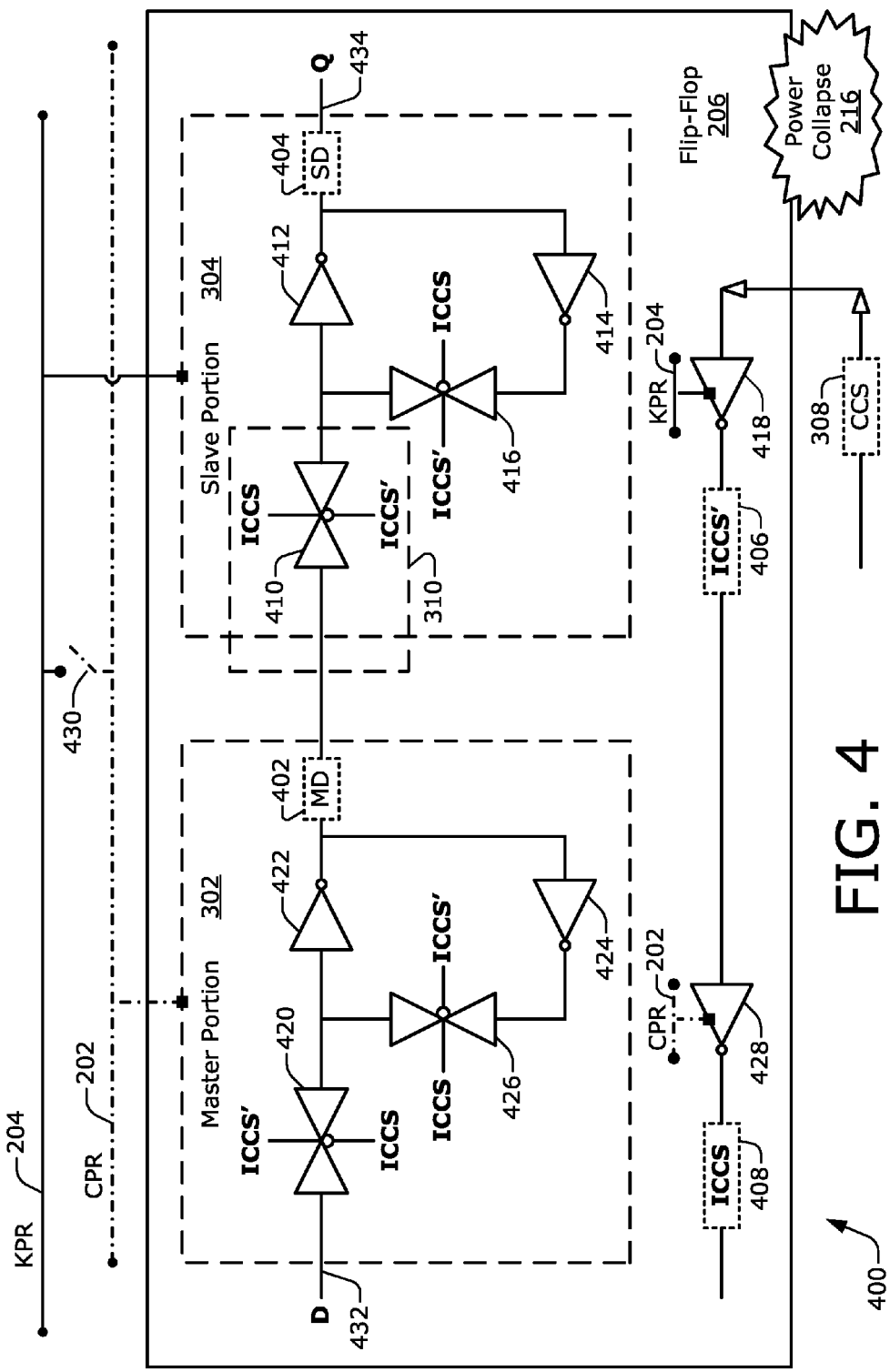
FIG. 4 depicts an example flip-flop including a master portion and a slave portion.

FIG. 4 depicts, generally at 400, an example flip-flop 206 including a master portion 302 and a slave portion 304 that are operably connected to the collapsible power rail 202 and the constant power rail 204, respectively. A switch 430 is provided between the collapsible power rail 202 and the constant power rail 204. When the switch 430 is in the open position, as shown here, a power collapse can occur. In addition to the master portion 302 and the slave portion 304, the flip-flop 206 includes an input 432 "D," an output 434 "Q," a first inverter 418, and a second inverter 428. As shown, the master portion 302 and the slave portion 304 each includes two pass gates and two inverters. These eight circuit devices are described below. The master portion 302 also includes master data 402 at an output of the master portion 302, and the slave portion 304 also includes slave data 404 at an output of the slave portion 304.

For one or more embodiments, the master portion 302 and the corresponding slave portion 304 of the flip-flop 206 are arranged in series. The input 432 of the flip-flop 206 coincides with an input of the master portion 302. The master data 402 is located at the output of the master portion 302. The output of the master portion 302 coincides with an input of the slave portion 304. The slave data 404 is located at the output of the slave portion 304. The output of the slave portion 304 coincides with the output 434 of the flip-flop 206. The master data 402 of the master portion 302 may be represented by a voltage level at the output of the master portion 302. The slave data 404 of the slave portion 304 may be represented by a voltage level at the output of the slave portion 304.

The master portion 302, and the individual circuit devices thereof, are coupled to and powered by the collapsible power rail 202. The slave portion 304, and the individual circuit devices thereof, are coupled to and powered by the constant power rail 204. The switch 430 is configured to selectively couple the collapsible power rail 202 to the constant power rail 204. The switch 430 illustrates an example of how the collapsible power rail 202 may be powered during normal operation and how the collapsible power rail 202 may be decoupled from power during the power collapse 216. During normal operation, the switch 430 is closed to couple the collapsible power rail 202 to the constant power rail 204 so as to provide power to the collapsible power rail 202 from the constant power rail 204.

In an example scenario for the power collapse 216, the switch 430 is opened such that power is removed from the collapsible power rail 202. The master portion 302 of the flip-flop 206 is configured to relinquish the master data 402 of the master portion 302 if power is removed from the collapsible power rail 202. If the master data 402 is relinquished, the voltage level at the output of the master portion 302 begins to drop or drift toward a ground voltage level. The slave portion 304 of the flip-flop 206, on the other hand, is configured to retain the slave data 404 of the slave portion 304 if power is removed from the collapsible power rail 202 by opening the switch 430. If the slave data 404 is retained during the power collapse 216, the slave data 404 is available for a subsequent computing task after the power collapse event ends.

As illustrated, the master portion 302 includes an interface pass gate 420, a forward inverter 422, a feedback inverter 424, and a feedback pass gate 426. The names of the pass gates and the inverters are assigned merely to facilitate understanding of the principles described herein, and the names are not intended to be limiting. The pass gates of the master portion 302 and of the slave portion 304 may be constructed using at least one field effect transistor (FET) per pass gate, such as two FETs for each pass gate. Each pass gate includes a negative gate terminal and a positive gate terminal. The negative gate terminal leads to an n-type FET (NFET), and the positive gate terminal leads to a p-type FET (PFET). Pass gates may also be termed transmission gates.

The interface pass gate 420 enables or disables an input interface for the master portion 302. The forward inverter 422 is aligned with a direction of data movement or migration across the flip-flop 206, and the feedback inverter 424 is aligned against a direction of data migration across the flip-flop 206. The feedback inverter 424 and the feedback pass gate 426 form part of a feedback path that maintains a current version of the master data 402 at the output of the master portion 302 if the feedback pass gate 426 is in a closed state.

More specifically, an input of the interface pass gate 420 coincides with an input of the master portion 302 as well as the input 432 of the flip-flop 206. An output of the interface pass gate 420 is coupled to an output of the feedback pass gate 426 and to an input of the forward inverter 422. An output of the forward inverter 422 drives the master data 402 and coincides with the output of the master portion 302. The output of the forward inverter 422 is coupled to an input of the feedback inverter 424. An output of the feedback inverter 424 is coupled to an input of the feedback pass gate 426. As noted above, the output of the feedback pass gate 426 is coupled to the output of the interface pass gate 420 and to the input of the forward inverter 422, which forms a feedback loop for the master portion 302 if the feedback pass gate 426 is in a closed state.

As illustrated, the slave portion 304 includes an interface pass gate 410, a forward inverter 412, a feedback inverter 414, and a feedback pass gate 416. The interface pass gate 410 enables or disables an input interface for the slave portion 304. The forward inverter 412 is aligned with a direction of data movement or migration across the flip-flop 206, and the feedback inverter 414 is aligned against a direction of data migration across the flip-flop 206. The feedback inverter 414 and the feedback pass gate 416 form part of a feedback path that maintains a current version of the slave data 404 at the output of the slave portion 304 if the feedback pass gate 416 is in a closed state.

For an example implementation, the interface pass gate 410 provides means for passing master data 402 from the master portion 302 to the slave portion 304. More specifically, an input of the interface pass gate 410 coincides with an input of the slave portion 304 as well as the output of the master portion 302. An output of the interface pass gate 410 is coupled to an output of the feedback pass gate 416 and to an input of the forward inverter 412. An output of the forward inverter 412 drives the slave data 404 and coincides with the output 434 of the flip-flop 206. The output of the forward inverter 412 is coupled to an input of the feedback inverter 414. An output of the feedback inverter 414 is coupled to an input of the feedback pass gate 416. As noted above, the output of the feedback pass gate 416 is coupled to the output of the interface pass gate 410 and to the input of the forward inverter 412, which forms a feedback loop for the slave portion 304 if the feedback pass gate 416 is in a closed state.

As described above with reference to FIG. 3, the power management circuitry 306 is configured to produce the combined control signal 308 (CCS) based on the clock signal 208 and the retention signal 210. The power management circuitry 306 is further configured to provide the combined control signal 308 to each flip-flop 206 of the multiple flip-flops 206-1 to 206-4 via at least one signal trace. As shown in FIG. 4, the combined control signal 308 is provided to the flip-flop 206 at an input of the first inverter 418.

For one or more embodiments, the first inverter 418, like the slave portion 304, is coupled to and powered by the constant power rail (KPR) 204 as shown. The second inverter 428, like the master portion 302, is coupled to and powered by the collapsible power rail (CPR) 202. An output of the first inverter 418 is coupled to an input of the second inverter 428. The first inverter 418 receives the combined control signal 308 and inverts a value of the combined control signal 308 to produce a complemented internal combined control signal 406 (ICCS') at the output of the first inverter 418. The complemented internal combined control signal 406 (ICCS') is provided to the input of the second inverter 428. The second inverter 428 inverts a value of the complemented internal combined control signal 406 (ICCS') to produce an internal combined control signal 408 (ICCS) at the output of the second inverter 428. The complemented internal combined control signal 406 (ICCS') and the internal combined control signal 408 (ICCS) are coupled to separate control terminals of the pass gates, as shown, to control whether each pass gate is open or closed.

For the interface pass gate 420 and the feedback pass gate 416, the complemented internal combined control signal 406 (ICCS') is fed to a negative gate terminal, and the internal combined control signal 408 (ICCS) is fed to a positive gate terminal. For the interface pass gate 410 and the feedback pass gate 426, the complemented internal combined control signal 406 (ICCS') is fed to a positive gate terminal, and the internal combined control signal 408 (ICCS) is fed to a negative gate terminal. An example operation of the flip-flop 206 is described in terms of positive-edge triggered pass gates; however, a flip-flop 206 may alternatively be implemented with negative-edge triggered circuit devices.

In a data hold mode for normal operation, data is not migrated from the master portion 302 to the slave portion 304. For the data hold mode, the interface pass gate 420 and the feedback pass gate 416 are both closed to permit signals to pass through pass gates 420 and 416, and the feedback pass gate 426 and the interface pass gate 410 are both open to prevent signals from passing through pass gates 426 and 410. To create these conditions for the data hold mode, the complemented internal combined control signal 406 (ICCS') is held at a high value, and the internal combined control signal 408 (ICCS) is held at a low level. In a data migration mode for normal operation, data is migrated from the master portion 302 to the slave portion 304. For the data migration mode, the interface pass gate 420 and the feedback pass gate 416 are both open to prevent signals from passing through pass gates 420 and 416, and the feedback pass gate 426 and the interface pass gate 410 are both closed to permit signals to pass through pass gates 426 and 410. To create these conditions for the data migration mode, the complemented internal combined control signal 406 (ICCS') is held at a low value and the internal combined control signal 408 (ICCS) is held at a high level.

For one or more embodiments, the isolation circuitry 310 may comprise part of the slave portion 304 as illustrated in FIG. 4. The isolation circuitry 310 is considered as part of the slave portion 304 here because the isolation circuitry 310 is powered by the constant power rail 204. An example implementation of the isolation circuitry 310 is a pass gate with control inputs that are properly configured and driven to isolate the slave portion 304 from the master portion 302 during the power collapse 216. In FIG. 4, the isolation circuitry 310 is implemented at least partially by the interface pass gate 410. In normal operation, the interface pass gate 410 is opened or closed based on a data hold mode or a data migration mode of the flip-flop 206 as described above. If the flip-flop 206 is migrating the master data 402 of the master portion 302 to be the next slave data 404 of the slave portion 304, the interface pass gate 410 is closed. If, on the other hand, the flip-flop 206 is not migrating data from the master portion 302 to the slave portion 304, the interface pass gate 410 is open and the feedback pass gate 416 is closed to maintain the current slave data 404 using the feedback loop that also includes the feedback inverter 414.

During the power collapse 216, to implement a retention feature for the flip-flop 206, the interface pass gate 410 is kept open to isolate the slave portion 304 from the master portion 302. The feedback pass gate 416 may be kept closed to ensure that the slave data 404 is retained by the slave portion 304. To place the interface pass gate 410 in an open state and the feedback pass gate 416 in a closed state, the complemented internal combined control signal 406 (ICCS') is driven to or maintained at a high voltage level, and the internal combined control signal 408 (ICCS) is driven to, maintained at, or permitted to drift to a low voltage level. To maintain the complemented internal combined control signal 406 (ICCS') and the internal combined control signal 408 (ICCS) at these voltage levels during the power collapse 216, the combined control signal 308 is maintained at a low voltage level during the power collapse 216. As indicated above, the second inverter 428 is powered by the collapsible power rail 202. The collapsibility of the second inverter 428 is enabled because the output thereof, the internal combined control signal 408 (ICCS), is configured to have a low value during the power collapse 216 while still contributing to the placement of the interface pass gate 410 in an open state and the feedback pass gate 416 in a closed state. Hence, the output of the second inverter 428 has a correct value for retaining the slave data 404 even if the second inverter 428 undergoes power collapse. Example approaches to driving or maintaining the combined control signal 308 at a low voltage level during the power collapse 216 are described herein with particular reference to FIGS. 5-7.

Figure 5:
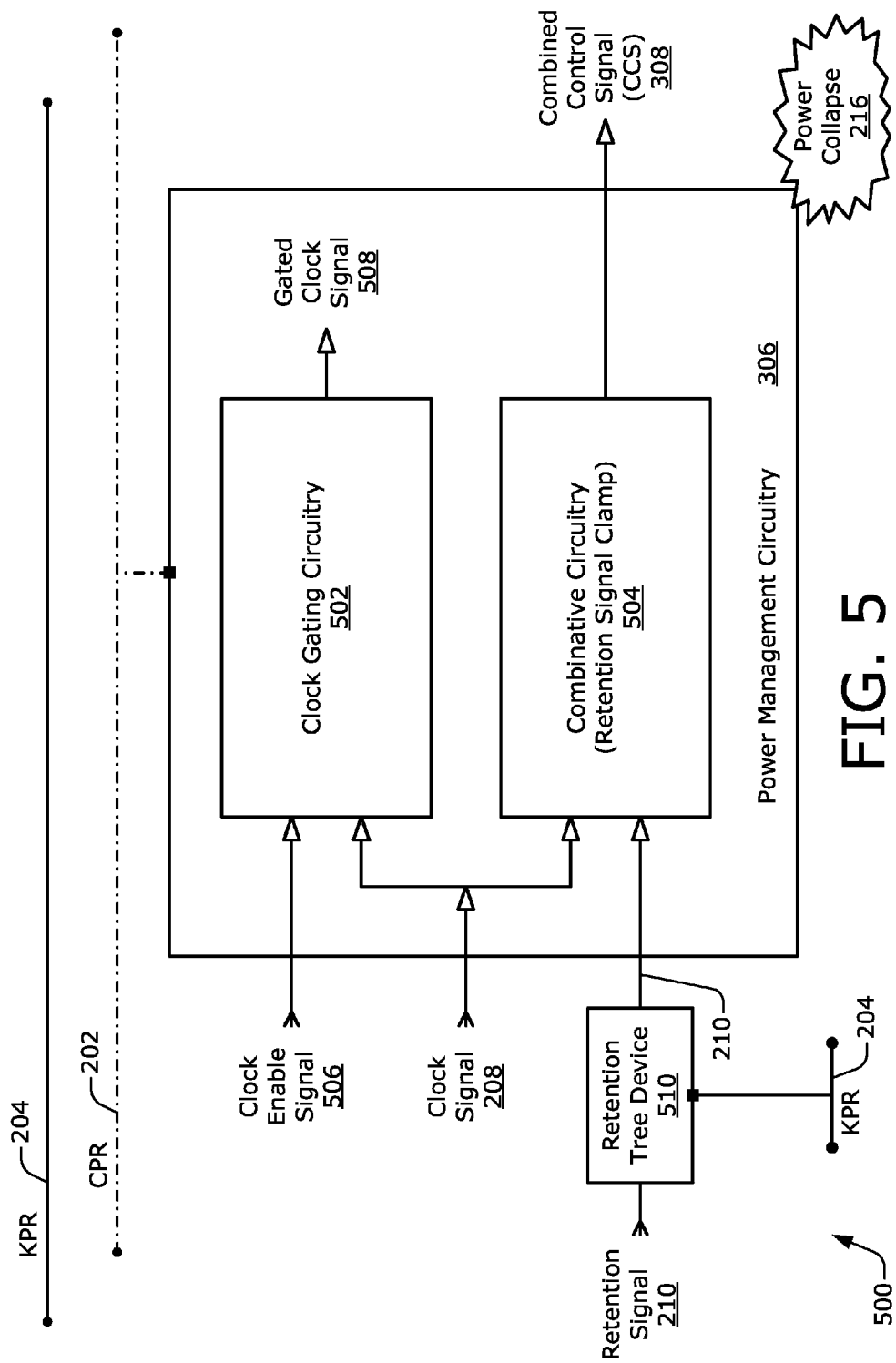
FIG. 5 depicts an example of power management circuitry that includes clock gating circuitry and combinative circuitry.

FIG. 5 depicts, generally at 500, an example of power management circuitry 306 that can be utilized during a power collapse 216. As illustrated, FIG. 5 includes the collapsible power rail 202, the constant power rail 204, the power management circuitry 306, and a retention tree device 510. FIG. 5 further illustrates the clock signal 208, the retention signal 210, the combined control signal 308, and a clock enable signal 506. The power management circuitry 306 includes clock gating circuitry 502 and combinative circuitry 504.

For one or more embodiments, the power management circuitry 306 is coupled to the collapsible power rail 202. The power management circuitry 306 is capable of undergoing power collapse and nevertheless fulfilling the described retention-related functionality during the power collapse 216. The retention signal 210 may be propagated over the IC portion 200 of FIG. 2 as part of a retention signal tree, which is not explicitly shown. A retention tree device 510 thereof, however, is shown. Hence, as part of propagating over a retention signal tree, the retention signal 210 may be routed through at least one retention tree device 510, such as a signal-boosting buffer, as the retention signal 210 traverses the retention signal tree. The retention tree device 510 is coupled to the constant power rail 204 to ensure that the retention signal 210 maintains sufficient strength to be active so as to indicate the existence of a retention operation throughout a time period of the power collapse 216.

As shown, the clock gating circuitry 502 receives as input the clock signal 208 and the clock enable signal 506. The clock enable signal 506 may indicate if pulses of the clock signal 208 are to be pruned at a certain point, deactivated from a certain chip area, or blocked from one or more circuit devices. This may be termed gating the clock signal. The clock gating circuitry 502 is configured to produce a gated clock signal 508 responsive to the clock signal 208 and the clock enable signal 506. After propagating through circuitry, such as a transistor or logical gate device, that is capable of gating the clock, the clock signal 208 may be termed the gated clock signal 508 even if the gating functionality is not currently active. Although not explicitly shown in FIG. 5, the gated clock signal 508 may be fed to the combinative circuitry 504 as a version of the clock signal 208. An example in which the clock signal 208 that is fed to the combinative circuitry 504 comprises the gated clock signal 508 is described herein with particular reference to FIG. 6.

As shown, the combinative circuitry 504 receives as input the clock signal 208 and the retention signal 210. The combinative circuitry 504 is configured to produce the combined control signal 308 responsive to the clock signal 208 and the retention signal 210. For an example implementation, the combinative circuitry 504 provides means for combining the clock signal 208 and the retention signal 210 into the combined control signal 308. At least one conductive line or at least one circuit trace, with or without one or more buffers, that couples the combinative circuitry 504 to the multiple flip-flops 206-1 to 206-4 serves to distribute the combined control signal 308 to each flip-flop 206 of the multiple flip-flops 206-1 to 206-4, to cause the slave portion 304 of each flip-flop 206 to retain the slave data 404 during the power collapse 216. The combinative circuitry 504 may effectively function as a retention signal clamp that clamps the combined control signal 308 to a given constant value. Clamping the combined control signal 308 at a constant value, as described herein, activates a retention feature of a flip-flop 206 of FIG. 4 such that the slave data 404 of the flip-flop 206 is retained during the power collapse 216. An example of the combinative circuitry 504 is described herein with particular reference to FIG. 6.

The power management circuitry 306, including the clock gating circuitry 502 and the combinative circuitry 504, provides means for generating the combined control signal 308 based on the clock signal 208 and the retention signal 210 such that the combined control signal 308 is clamped at a constant value while the retention signal 210 is active and such that the combined control signal 308 is periodic with a period that is the same as that of the clock signal 208 while the retention signal 210 is not active. Example implementations at the gate level for the clock gating circuitry 502 and the combinative circuitry 504 are described herein with particular reference to FIG. 6. Example implementations at the transistor level for a NOR gate implementation of the combinative circuitry 504 are described herein with particular reference to FIG. 7.

Figure 6:
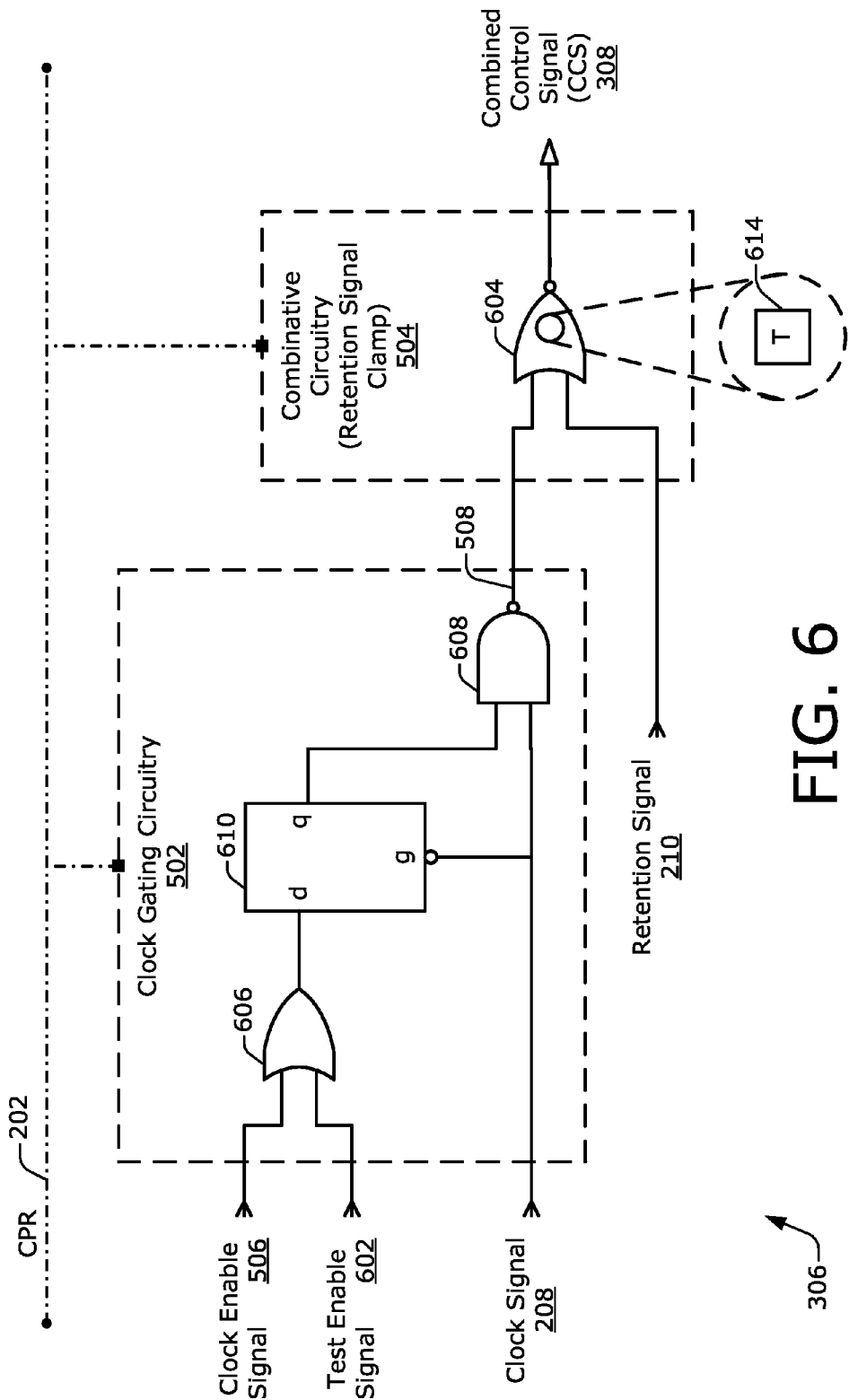
FIG. 6 depicts an example of clock gating circuitry and an example of combinative circuitry.

FIG. 6 depicts an example of clock gating circuitry 502 and an example of combinative circuitry 504 as part of the power management circuitry 306 of FIGS. 3 and 5. As illustrated, FIG. 6 also depicts the collapsible power rail 202, the clock signal 208, the retention signal 210, the combined control signal 308, the clock enable signal 506, the gated clock signal 508, and a test enable signal 602. The clock gating circuitry 502 includes an OR gate 606, a dq flip-flop 610, and a NAND gate 608. The combinative circuitry 504 includes a NOR gate 604.

For one or more embodiments, the collapsible power rail 202 is coupled to and powers the clock gating circuitry 502 and the combinative circuitry 504. The clock enable signal 506 is coupled to an upper input of the OR gate 606, and the test enable signal 602 is coupled to a lower input of the OR gate 606. An output of the OR gate 606 is coupled to the "d" input of the dq flip-flop 610. The "q" output of the dq flip-flop 610 is coupled to an upper input of the NAND gate 608. The clock signal 208 is coupled to a lower input of the NAND gate 608. The clock signal 208 is also coupled to an inverting input "g" of the dq flip-flop 610 to advance data through the dq flip-flop 610. The output of the NAND gate 608 produces the gated clock signal 508.

In the example of FIG. 6, a version of the clock signal 208 that is provided to the combinative circuitry 504 comprises the gated clock signal 508. More specifically, the gated clock signal 508 is coupled to an upper input of the NOR gate 604. The retention signal 210 is coupled to a lower input of the NOR gate 604. A signal provided at an output of the NOR gate 604 comprises the combined control signal 308. The NOR gate 604 is comprised of one or more circuit devices, such as at least one transistor 614. The at least one transistor 614 comprises, for example, an n-type metal-oxide-semiconductor (NMOS) transistor. Utilization of an NMOS transistor, for instance, as the at least one transistor 614 enables the combinative circuitry 504 to be powered by the collapsible power rail 202 because the NMOS transistor pulls down the output node of the NOR gate 604. This functionality is explained below generally with continuing reference to FIG. 6 and more specifically with reference to FIG. 7, which illustrates multiple transistors for an example implementation of the NOR gate 604.

In an example operation, starting with the clock gating circuitry 502, the "d" input of the dq flip-flop 610 is at a high level if either or both of the clock enable signal 506 or the test enable signal 602 is at a high level due to the logical inclusive OR operation of the OR gate 606. Hence, the "d" input of the dq flip-flop 610 is at a high level unless both the clock enable signal 506 is at a low level because the clock gating circuitry is currently tasked with gating the clock and the test enable signal 602 is at a low level because testing is not occurring. If the "d" input of the dq flip-flop 610 is high, then the "q" output is also high. This high value of the "q" output of the dq flip-flop 610 is fed to the upper input of the NAND gate 608. Due to this high value at the upper input of the NAND gate 608, the gated clock signal 508 is an inverted version of the clock signal 208 due to the logical NAND operation thereof. The gated clock signal 508 is provided to the upper input of the NOR gate 604 and is inverted again due to the logical NOR operation thereof as long as the retention signal 210 is not active and is low. If the gated clock signal 508 were not routed through the NOR gate 604 of the combinative circuitry 504 and were instead being routed directly to circuitry that is being clocked, the NAND gate 608 could be substituted with an AND gate.

Continuing with the example operation, for the combinative circuitry 504, the gated clock signal 508 is coupled to the upper input of the NOR gate 604, with the gated clock signal 508 comprising an inverted version of the clock signal 208 if the clock is not currently being gated by the clock gating circuitry 502. If the retention signal 210 is not active, the retention signal 210 is at a low level. So for a normal, non-retention mode of operation, the NOR gate 604 outputs an inverted version of the gated clock signal 508 as the combined control signal 308. In this normal mode of operation, values of the combined control signal 308 therefore track values of the clock signal 208.

In a retention mode of operation, on the other hand, the retention signal 210 is active and is driven to a high level at the lower input of the NOR gate 604. The retention signal 210 may remain at a high level during a power collapse event because the retention signal 210 is distributed over a retention signal tree of an integrated circuit chip using one or more retention tree devices 510 that are powered by the constant power rail 204, as is shown in FIG. 5. Due to the high value at the lower input of the NOR gate 604 and the logical NOR operation thereof, the combined control signal 308 that is output from the NOR gate 604 is low regardless of the value of the gated clock signal 508 at the upper input of the NOR gate 604. For an example implementation, the NOR gate 604 provides means for clamping the combined control signal 308 low while the power is decoupled from the collapsible power rail 202. This low level for the combined control signal 308 is routed to each flip-flop 206 of the multiple flip-flops 206-1 to 206-4 of FIG. 3 at the input of the first inverter 418 of FIG. 4.

Because an NMOS implementation of the at least one transistor 614 is pulling the output node of the NOR gate 604 low (e.g., to ground) in this retention mode example, a low level for the combined control signal 308 continues to be output from the NOR gate 604 if or while the collapsible power rail 202 is uncoupled from power during a power collapse event. A low level for the combined control signal 308 continues to be output from the NOR gate 604 during a power collapse event even though the NOR gate 604 is connected to the collapsible power rail 202 because, at least in part, the retention signal 210 is capable of being maintained during the power collapse event at an active high level by a device, such as at least one gate of the retention tree device 510, that is powered by the constant power rail 204, as is shown in FIG. 5. For an example implementation of the NOR gate 604, an NMOS implementation of the at least one transistor 614 provides means for pulling down a voltage level if the retention signal 210 is active. An example implementation of the NOR gate 604, which includes NMOS and PMOS transistors, is described with reference to FIG. 7.

Figure 7:
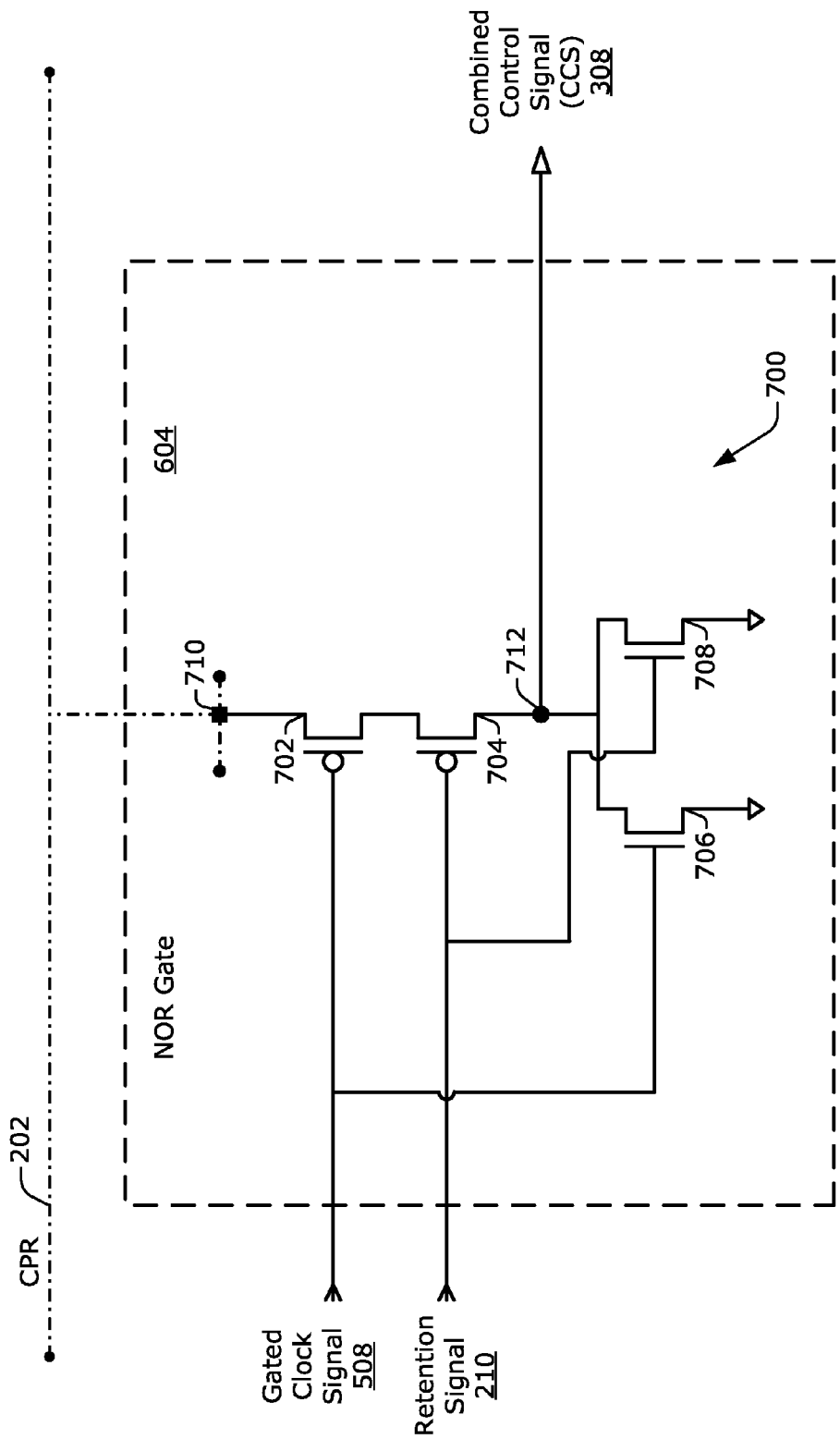
FIG. 7 depicts a circuit that includes four devices for an example implementation of a NOR gate for combinative circuitry.

FIG. 7 depicts a circuit 700 that includes four devices for an example implementation of the NOR gate 604 for the combinative circuitry 504, of FIGS. 5 and 6. More specifically, the illustrated example implementation of the NOR gate 604 includes four transistors: a first PMOS transistor 702, a second PMOS transistor 704, a first NMOS transistor 706, and a second NMOS transistor 708. The circuit 700 also includes a power node 710 and an output node 712. FIG. 7 also depicts the retention signal 210, the combined control signal 308, and the gated clock signal 508.

For one or more embodiments, the first PMOS transistor 702 and the second PMOS transistor 704 are coupled in series between the power node 710 and the output node 712. The first NMOS transistor 706 and the second NMOS transistor 708 are coupled in parallel between the output node 712 and ground. The power node 710 is coupled to the collapsible power rail 202; hence, the circuit 700 is powered by the collapsible power rail 202. The gated clock signal 508 is coupled to the gate inputs of the first PMOS transistor 702 and the first NMOS transistor 706. The retention signal 210 is coupled to the gate inputs of the second PMOS transistor 704 and the second NMOS transistor 708. The circuit 700 produces the combined control signal 308 and provides the combined control signal 308 at the output node 712.

In an example operation, both the gated clock signal 508 and the retention signal 210 may be low. If so, these low values turn on both the first PMOS transistor 702 and the second PMOS transistor 704. These two low values also turn off the first NMOS transistor 706 and the second NMOS transistor 708. In this condition, the output node 712 is driven high to a voltage that matches that of the collapsible power rail 202. Hence, the combined control signal 308 is at a high level if both of the gated clock signal 508 and the retention signal 210 are low. On the other hand, either or both of the gated clock signal 508 and the retention signal 210 may be high. If either or both are high, at least one of the first PMOS transistor 702 or the second PMOS transistor 704 is turned off, and at least one of the first NMOS transistor 706 or the second NMOS transistor 708 is turned on. If at least one of the first NMOS transistor 706 or the second NMOS transistor 708 is turned on, the at least one transistor that is turned on pulls the voltage level of the power node 710 down to drive the combined control signal 308 to a low level.

Consequently, if the retention signal 210 is active, or asserted, at a high level the combined control signal 308 can be clamped low and routed to each flip-flop 206 of the multiple flip-flops 206-1 to 206-4 of FIG. 3 via the input of the first inverter 418 of FIG. 4. More specifically, because the retention signal 210 is distributed using at least one retention tree device 510 of FIG. 5 that is powered by the constant power rail 204, the retention signal 210 may remain at a high level even if the collapsible power rail 202 is collapsed. The high voltage level of the retention signal 210 is coupled to the gate of the second PMOS transistor 704 to turn it off and is coupled to the gate of the second NMOS transistor 708 to turn it on. With the second NMOS transistor 708 turned on, the output node 712 is brought down to the ground voltage level, which causes the combined control signal 308 to be at a low level to therefore place the isolation circuitry 310 of FIGS. 3 and 4 in a correct state to isolate the slave data 404 from collapsing devices. Moreover, because the combined control signal 308 performs this isolation control functionality at a low voltage level, the NOR gate 604 may be powered by the collapsible power rail 202 because the output node 712 drifts to a low level if the power is collapsed.

Chip area utilization and trace routing congestion may also be reduced in the context of resetting the output value of flip-flops. Depending on the internal circuitry of a resettable flip-flop, an active reset signal causes a value of the output of the resettable flip-flop to be reset to a zero (0) or a one (1). Reset circuitry 312 of FIG. 3 may be shared for multiple flip-flops instead of being duplicated for each flip-flop. Furthermore, sharing reset circuitry 312 can reduce a number of wire traces routed to each flip-flop by combining a reset signal 212 with a retention signal 210 to produce a clampable reset signal. Example aspects are described herein with particular reference to FIGS. 8 and 9. For FIG. 8, the multiple flip-flops 206-1 to 206-4 are reset responsive to the reset signal 212 being at or transitioning to an active high state. For FIG. 9, the multiple flip-flops 206-1 to 206-4 are reset responsive to the reset signal 212 being at or transitioning to an active low state.

Figure 8:
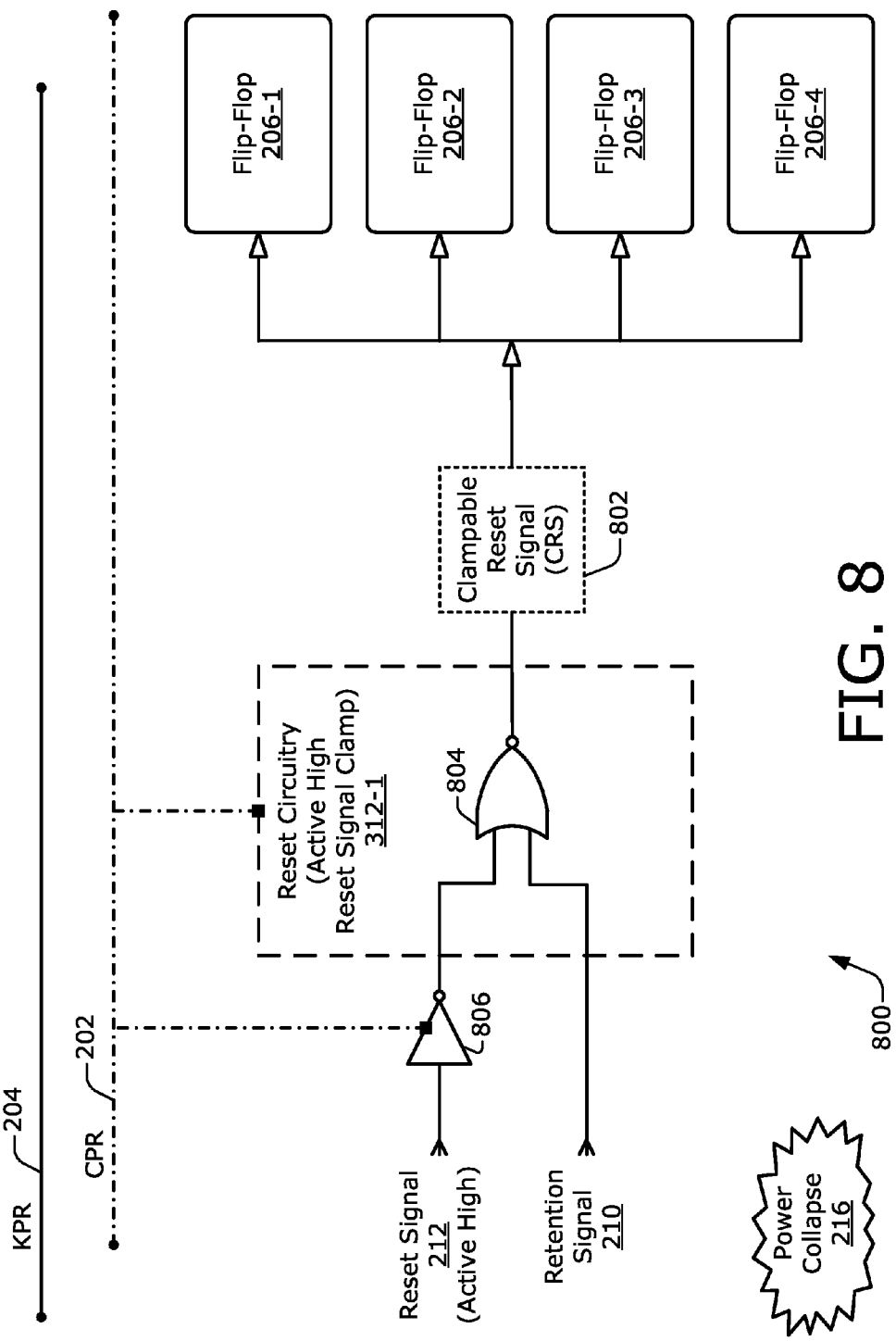
FIG. 8 depicts an example reset control arrangement in a power collapse environment for multiple flip-flops that are resettable responsive to an active high reset signal.

FIG. 8 depicts an example reset control arrangement 800 in an environment that provides for a power collapse 216 for multiple flip-flops 206-1 to 206-4 that are resettable responsive to an active high reset signal. As illustrated, reset control arrangement 800 includes the collapsible power rail 202, the constant power rail 204, reset circuitry 312-1, an inverter 806, and the multiple flip-flops 206-1 to 206-4. The reset control arrangement 800 further includes the reset signal 212, the retention signal 210, and a clampable reset signal 802 (CRS). The reset circuitry 312-1 includes a NOR gate 804 as shown. With the multiple flip-flops 206-1 to 206-4 implemented as resettable flip-flops, an output of a flip-flop 206 can be forced to a value of zero or one by driving a reset signal high. Hence, the reset circuitry 312-1 operates with flip-flops that are reset if the reset signal 212 is driven high.

For one or more embodiments, the reset circuitry 312-1 is disposed external to the multiple flip-flops 206-1 to 206-4. The reset circuitry 312-1 is configured to combine the reset signal 212 and the retention signal 210 to produce the clampable reset signal 802. The reset circuitry 312-1 receives as input the retention signal 210 as well as the reset signal 212 via the inverter 806. The reset circuitry 312-1 and the inverter 806 are coupled to the collapsible power rail 202. Although shown external to the reset circuitry 312-1, the inverter 806 may alternatively be part of the reset circuitry 312-1. For a reset operation, the reset signal 212 is driven high while the retention signal 210 remains inactive low. Because of the inverter 806, both of the inputs to the NOR gate 804 are low, so the output of the reset circuitry 312-1 is high to cause a reset of the multiple flip-flops 206-1 to 206-4 for an example combinative operation in a non-retention mode.

For an example implementation, the reset circuitry 312-1 provides means for generating the clampable reset signal 802 based on the reset signal 212 and the retention signal 210 such that the clampable reset signal 802 is clamped at a constant value while the retention signal 210 is active. For the multiple flip-flops 206-1 to 206-4 that are reset with an active high reset signal as with the reset control arrangement 800, the clampable reset signal 802 is clamped at a constant value of zero (e.g., ground) during the power collapse 216. The reset circuitry 312-1 is further configured to provide the clampable reset signal 802 to each flip-flop 206 of the multiple flip-flops 206-1 to 206-4, such as to a reset input (not explicitly shown) of each flip-flop 206. For an example implementation, at least one conductive line or at least one circuit trace, with or without one or more buffers, that couples the reset circuitry 312-1 to the multiple flip-flops 206-1 to 206-4 yields means for providing the clampable reset signal 802 to the multiple flip-flops 206-1 to 206-4.

For an example combinative operation of the reset circuitry 312-1 in a retention mode, the reset signal 212 and the retention signal 210 are coupled to inputs of the NOR gate 804. The NOR gate 804 may be implemented, for instance, analogously to the NOR gate 604 of FIG. 7 with the gated clock signal 508 and the combined control signal 308 thereof being respectively replaced by the reset signal 212 and the clampable reset signal 802 of FIG. 8. If the retention signal 210 is active high, then the clampable reset signal 802 at the output of the NOR gate 804 is clamped low, regardless of a state of the reset signal 212 or a power level of the collapsible power rail 202. Hence, the multiple flip-flops 206-1 to 206-4 can be prevented from being accidentally reset during the power collapse 216. The reset circuitry 312-1 may therefore function as an active high reset signal clamp that is external to the multiple flip-flops 206-1 to 206-4. By using the collapsible power rail 202 for the reset circuitry 312-1, which is enabled by employing at least one NMOS pull-down transistor in the NOR gate 804 as analogously described above with reference to FIG. 7, routing of the constant power rail 204 to the reset circuitry 312-1 may be avoided.

Figure 9:
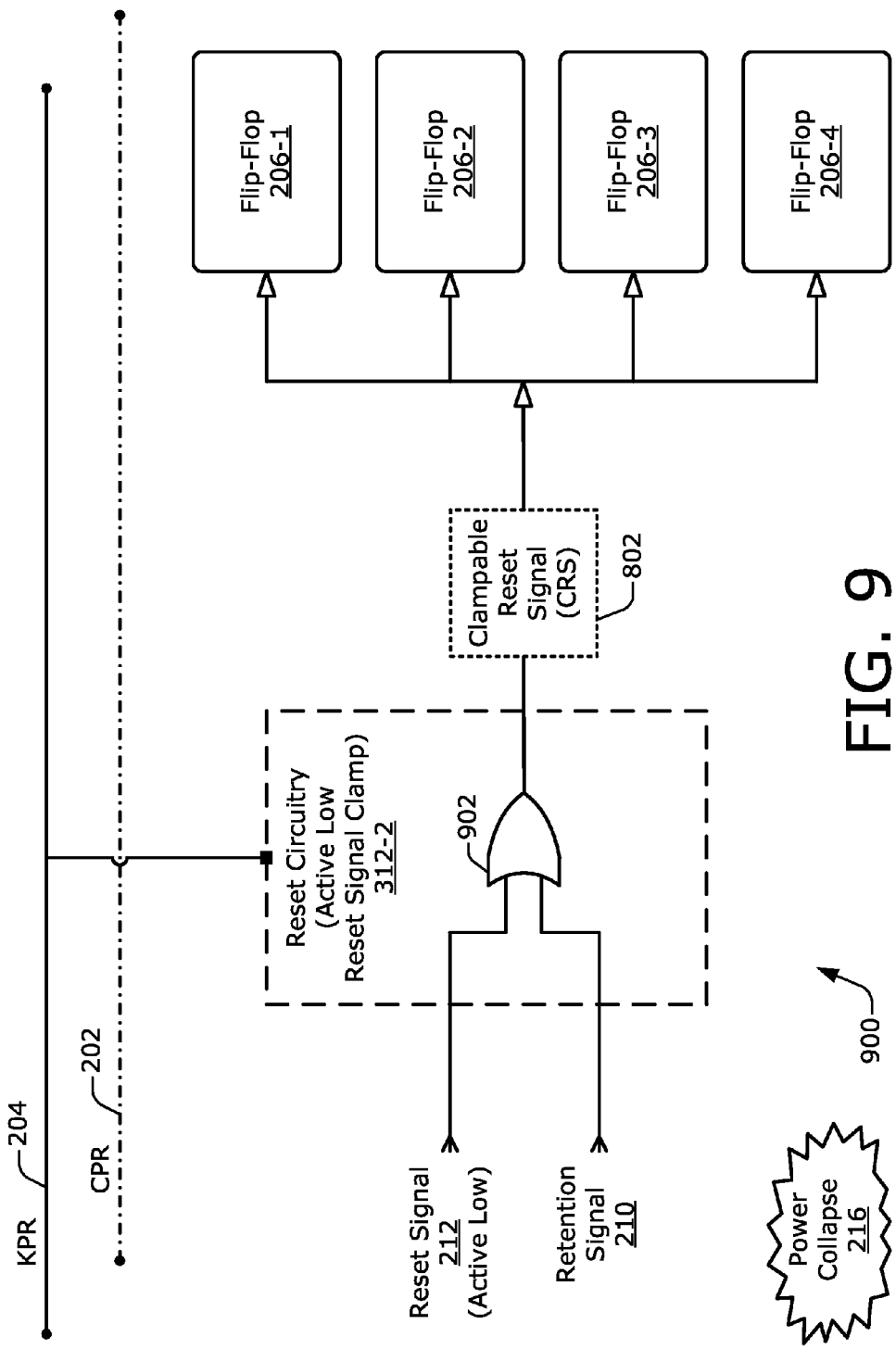
FIG. 9 depicts an example reset control arrangement in a power collapse environment for multiple flip-flops that are resettable responsive to an active low reset signal.

FIG. 9 depicts an example reset control arrangement 900 in an environment that provides for a power collapse 216 for multiple flip-flops 206-1 to 206-4 that are resettable responsive to an active low reset signal. As illustrated, reset control arrangement 900 includes the collapsible power rail 202, the constant power rail 204, reset circuitry 312-2, and the multiple flip-flops 206-1 to 206-4. The reset control arrangement 900 further includes the reset signal 212, the retention signal 210, and the clampable reset signal 802 (CRS). The reset circuitry 312-2 includes an OR gate 902 as shown. With the multiple flip-flops 206-1 to 206-4 implemented as resettable flip-flops, an output of a flip-flop 206 can be forced to a value of zero or one by driving a reset signal low. Hence, the reset circuitry 312-2 operates with flip-flops that are reset if the reset signal 212 is driven low.

For one or more embodiments, the reset circuitry 312-2 is disposed external to the multiple flip-flops 206-1 to 206-4. The reset circuitry 312-2 is configured to combine the reset signal 212 and the retention signal 210 to produce the clampable reset signal 802. For an example implementation, the reset circuitry 312-2 provides means for generating the clampable reset signal 802 based on the reset signal 212 and the retention signal 210 such that the clampable reset signal 802 is clamped at a constant value while the retention signal 210 is active. For the multiple flip-flops 206-1 to 206-4 that are reset with an active low reset signal as with the reset control arrangement 900, the clampable reset signal 802 is clamped at a constant value of one (e.g., a high voltage) during the power collapse 216. The reset circuitry 312-2 is further configured to provide the clampable reset signal 802 to each flip-flop 206 of the multiple flip-flops 206-1 to 206-4, such as to a reset input (not explicitly shown) of each flip-flop 206. For an example implementation, at least one conductive line or at least one circuit trace, with or without one or more buffers, that couples the reset circuitry 312-2 to the multiple flip-flops 206-1 to 206-4 yields means for providing the clampable reset signal 802 to the multiple flip-flops 206-1 to 206-4.

For an example combinative operation of the reset circuitry 312-2, the reset signal 212 and the retention signal 210 are coupled to inputs of the OR gate 902. The OR gate 902 may be implemented using circuit devices for a NOR gate followed by circuit devices for an inverter. More specifically, with reference to the circuit devices illustrated in FIG. 7, an inverter may be included after the node 712 to produce an OR gate that outputs the clampable reset signal 802 of FIG. 9. At least the inverter that outputs the clampable reset signal 802 is tied to the constant power rail 204. As an alternative example, the reset circuitry 312-2 may be implemented using an inverter that receives the retention signal 210 followed by an AND gate that receives as inputs the reset signal 212 and the inverted retention signal 210. If the retention signal 210 is active high, then the clampable reset signal 802 at the output of the OR gate 902 is clamped high, regardless of a state of the reset signal 212 or a power level of the collapsible power rail 202. Hence, the multiple flip-flops 206-1 to 206-4 can be prevented from being accidentally reset during the power collapse 216. The reset circuitry 312-2 may therefore function as an active low reset signal clamp that is external to the multiple flip-flops 206-1 to 206-4. By using the constant power rail 204 for at least part of the reset circuitry 312-2, such as to power at least an output inverter thereof, the clampable reset signal 802 can be clamped at a high voltage value during the power collapse 216.

Figure 10:
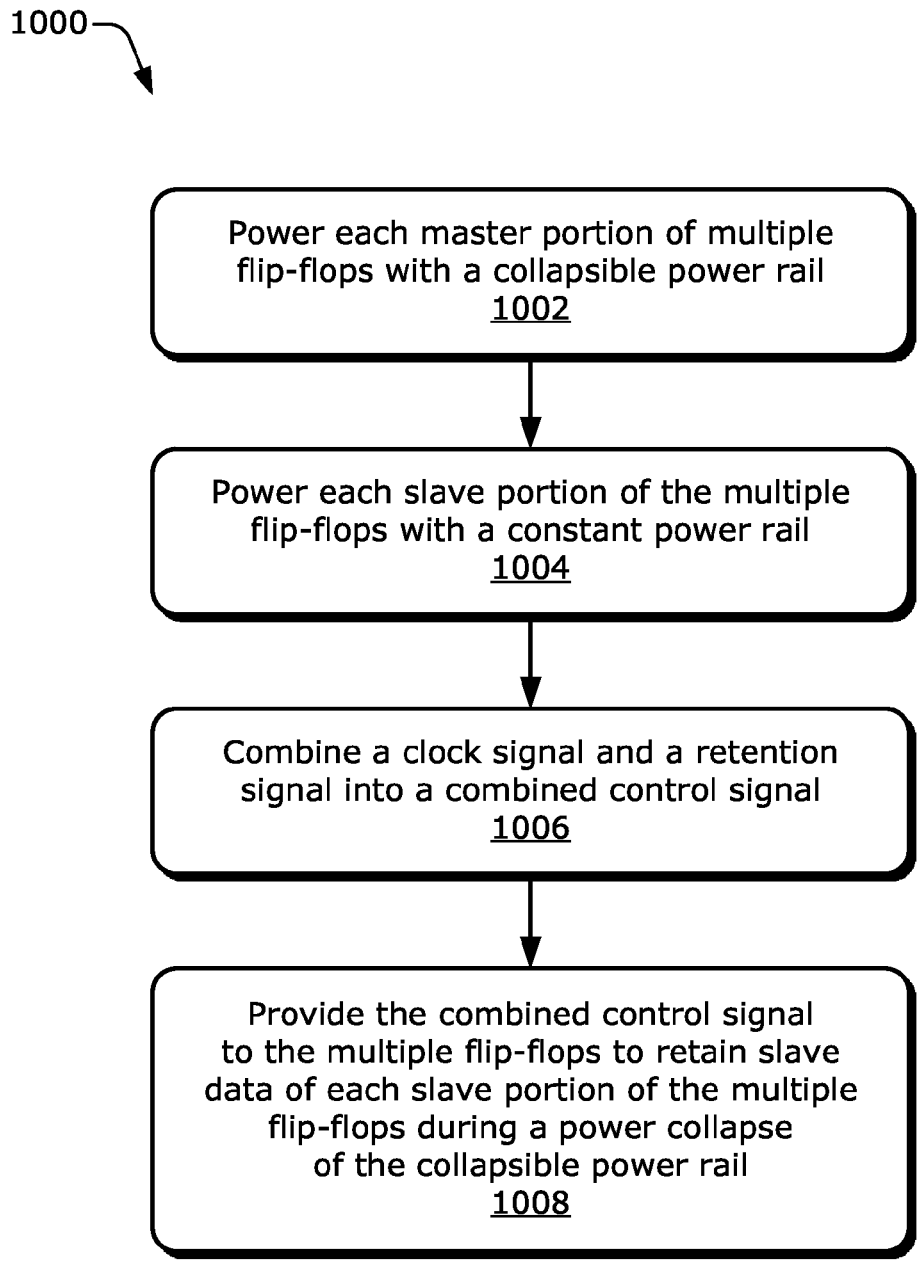
FIG. 10 is a flow diagram illustrating an example process for power management with flip-flops.

FIG. 10 is a flow diagram illustrating an example process 1000 for power management with flip-flops. Process 1000 is described in the form of a set of blocks 1002-1008 that specify operations that may be performed. However, operations are not necessarily limited to the order shown in FIG. 10 or described herein, for the operations may be implemented in alternative orders or in fully or partially overlapping manners. Operations represented by the illustrated blocks of process 1000 may be performed by an integrated circuit, such as the IC 110 of FIG. 1. More specifically, the operations of process 1000 may be performed by the retention control arrangement 300 of FIG. 3 that is part of the IC portion 200 of FIG. 2.

At block 1002, the integrated circuit powers each master portion of multiple flip-flops with a collapsible power rail. For example, the IC portion 200 or an associated PMIC may power each master portion 302 of multiple flip-flops 206-1 to 206-4 with a collapsible power rail 202.

At block 1004, the integrated circuit powers each slave portion of the multiple flip-flops with a constant power rail. For example, the IC portion 200 or an associated PMIC may power each slave portion 304 of the multiple flip-flops 206-1 to 206-4 with a constant power rail 204.

At block 1006, the integrated circuit combines a clock signal and a retention signal to produce a combined control signal. For example, power management circuitry 306 may combine a clock signal 208 and a retention signal 210 to produce a combined control signal 308.

In an example implementation of the combination operation of block 1006, the integrated circuit further clamps, responsive to an active state of the retention signal, the combined control signal at a value that prevents a change to the slave data of each slave portion of the multiple flip-flops if each corresponding master portion undergoes power collapse. For instance, responsive to an active state of the retention signal 210, power management circuitry 306 may clamp the combined control signal 308 at a value, such as zero, that prevents a change to the slave data 404 of each slave portion 304 of the multiple flip-flops 206-1 to 206-4 if each corresponding master portion 302 undergoes a power collapse 216. In another example implementation of the process 1000, the integrated circuit further powers circuitry that performs the combination operation of block 1006 with the collapsible power rail. For instance, power management circuitry 306 may be powered by the collapsible power rail 202.

In another example implementation of the combination operation of block 1006, the clock signal comprises a gated clock signal, and the integrated circuit further combines the gated clock signal and the retention signal to produce the combined control signal. For instance, the clock signal 208 may comprise a gated clock signal 508, and the power management circuitry 306 may combine the gated clock signal 508 and the retention signal 210 to produce the combined control signal 308.

At block 1008, the integrated circuit provides the combined control signal to the multiple flip-flops to retain slave data of each slave portion of the multiple flip-flops during a power collapse of the collapsible power rail. For example, power management circuitry 306 may provide the combined control signal 308 to the multiple flip-flops 206-1 to 206-4 to retain slave data 404 of each slave portion 304 of the multiple flip-flops 206-1 to 206-4 during a power collapse 216 of the collapsible power rail 202.

In an example implementation of the providing operation of block 1008, the integrated circuit further isolates each slave portion of the multiple flip-flops from each corresponding master portion during the power collapse responsive to a state of the combined control signal. For instance, the isolation circuitry 310 may isolate each slave portion 304 of the multiple flip-flops 206-1 to 206-4 from each corresponding master portion 302 during the power collapse 216 responsive to a voltage value of the combined control signal 308.

In an example implementation of the process 1000, the integrated circuit further combines a reset signal and the retention signal to produce a clampable reset signal and provides the clampable reset signal to the multiple flip-flops to prevent reset of the multiple flip-flops during the power collapse. For instance, reset circuitry 312 may combine a reset signal 212 and the retention signal 210 to produce a clampable reset signal 802. The reset circuitry may also provide the clampable reset signal 802 to the multiple flip-flops 206-1 to 206-4 to prevent reset of the multiple flip-flops 206-1 to 206-4 during the power collapse 216.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
   a constant power rail;
   a collapsible power rail;
   multiple flip-flops, each flip-flop of the multiple flip-flops including:
      a master portion coupled to the collapsible power rail; and
      a slave portion coupled to the constant power rail; and
   power management circuitry configured to:
      combine a clock signal and a retention signal into a combined control signal; and
      provide the combined control signal to each flip-flop of the multiple flip-flops to isolate the slave portion from the master portion of each flip-flop while the collapsible power rail is collapsed.

2. The integrated circuit of claim 1, wherein the power management circuitry is further configured to clamp the combined control signal at a constant value responsive to an active state of the retention signal.

3. The integrated circuit of claim 1, wherein each flip-flop of the multiple flip-flops is configured to isolate the master portion from the slave portion and retain slave data stored by the slave portion at an output of the slave portion responsive to the combined control signal.

4. The integrated circuit of claim 1, wherein:
   the master portion of each flip-flop of the multiple flip-flops is configured to relinquish master data of the master portion if the collapsible power rail is collapsed; and
   the slave portion of each flip-flop of the multiple flip-flops is configured to retain slave data of the slave portion if the collapsible power rail is collapsed.

5. The integrated circuit of claim 1, further comprising:
   a first inverter having an input and an output, the input of the first inverter configured to receive the combined control signal from the power management circuitry, and the output of the first inverter configured to produce a complemented internal combined control signal; and
   a second inverter having an input and an output, the input of the second inverter configured to receive the complemented internal combined control signal, and the output of the second inverter configured to produce an internal combined control signal.

6. The integrated circuit of claim 5, wherein:
   the first inverter is coupled to the constant power rail;
   the second inverter is coupled to the collapsible power rail; and
   the slave portion of each flip-flop of the multiple flip-flops includes a pass gate configured to receive the complemented internal combined control signal and the internal combined control signal, the pass gate configured to be open if the combined control signal is driven low by the power management circuitry.

7. The integrated circuit of claim 1, wherein the power management circuitry includes combinative circuitry configured to combine the clock signal and the retention signal to produce the combined control signal.

8. The integrated circuit of claim 7, wherein the combinative circuitry comprises a NOR gate.

9. The integrated circuit of claim 7, wherein the combinative circuitry is coupled to the collapsible power rail.

10. The integrated circuit of claim 1, wherein the power management circuitry includes clock gating circuitry configured to gate the clock signal to reduce power consumption based on a state of a clock enable signal.

11. The integrated circuit of claim 1, further comprising:
    reset circuitry disposed external to the multiple flip-flops, the reset circuitry configured to combine a reset signal and the retention signal to produce a clampable reset signal that is clamped low if the retention signal is active, the reset circuitry further configured to provide the clampable reset signal to each flip-flop of the multiple flip-flops.

12. The integrated circuit of claim 1, further comprising:
    reset circuitry disposed external to the multiple flip-flops, the reset circuitry configured to combine a reset signal and the retention signal to produce a clampable reset signal that is clamped high if the retention signal is active, the reset circuitry further configured to provide the clampable reset signal to each flip-flop of the multiple flip-flops.

13. An integrated circuit comprising:
    a constant power rail;
    a collapsible power rail configured to be decoupled from power while the collapsible power rail is collapsed;
    multiple flip-flops, each flip-flop of the multiple flip-flops including:
       a master portion coupled to the collapsible power rail; and
       a slave portion configured to store slave data and coupled to the constant power rail;
    means for generating a combined control signal based on a clock signal and a retention signal such that the combined control signal is clamped at a constant value while the retention signal is active and such that the combined control signal is periodic having a period of the clock signal while the retention signal is not active; and
    circuitry configured to distribute the combined control signal to each flip-flop of the multiple flip-flops to isolate the slave portion from the master portion of each flip-flop while the collapsible power rail is collapsed.

14. The integrated circuit of claim 13, wherein the combined control signal is configured to cause the slave portion of each flip-flop to retain the slave data if the retention signal is active.

15. The integrated circuit of claim 13, wherein:
    the means for generating the combined control signal is coupled to the collapsible power rail.

16. The integrated circuit of claim 13, wherein the slave portion of each flip-flop of the multiple flip-flops includes means for isolating the slave portion from the master portion of each flip-flop.

17. The integrated circuit of claim 16, wherein:
    the means for isolating comprises means for passing master data from the master portion to the slave portion; and
    the means for passing master data is configured to be controlled based on the combined control signal.

18. The integrated circuit of claim 13, wherein the means for generating the combined control signal is configured to pull the combined control signal to ground if the retention signal is active.

19. The integrated circuit of claim 18, wherein the retention signal is distributed by circuitry coupled to the constant power rail.

20. The integrated circuit of claim 13, further comprising:
means for generating a clampable reset signal based on a reset signal and the retention signal such that the clampable reset signal is clamped at a constant value while the retention signal is active.

21. A method for power management of flip-flops, comprising:
powering each master portion of multiple flip-flops with a collapsible power rail;
powering each slave portion of the multiple flip-flops with a constant power rail;
combining a clock signal and a retention signal to produce a combined control signal; and
providing the combined control signal to the multiple flip-flops to retain slave data of each slave portion of the multiple flip-flops during a power collapse of the collapsible power rail and to isolate each slave portion from each master portion of the multiple flip-flop while the collapsible power rail is collapsed.

22. The method of claim 21, wherein the combining comprises clamping, responsive to the retention signal, the combined control signal at a value that prevents a change to the slave data of each slave portion of the multiple flip-flops if each corresponding master portion undergoes power collapse.

23. The method of claim 21, wherein:
the clock signal comprises a gated clock signal; and
the combining comprises combining the gated clock signal and the retention signal to produce the combined control signal.

24. The method of claim 21, further comprising:
powering circuitry that performs the combining with the collapsible power rail.

25. The method of claim 21, wherein the providing comprises isolating each slave portion of the multiple flip-flops from each corresponding master portion during the power collapse responsive to the combined control signal.

26. The method of claim 21, further comprising:
combining a reset signal and the retention signal to produce a clampable reset signal; and
providing the clampable reset signal to the multiple flip-flops to prevent reset of the multiple flip-flops during the power collapse.

27. An integrated circuit comprising:
a first flip-flop including a master portion and a slave portion, the master portion configured to undergo a power collapse and the slave portion configured to retain slave data during the power collapse;
a second flip-flop including a master portion and a slave portion, the master portion configured to undergo the power collapse and the slave portion configured to retain slave data during the power collapse; and
power management circuitry configured to produce a combined control signal based on a clock signal and a retention signal and to provide the combined control signal to the first flip-flop and the second flip-flop, the combined control signal having a value configured to cause the slave portion of the first flip-flop and the slave portion of the second flip-flop to isolate the slave portion from the master portion of each of the first flip-flop and the second flip-flop and to retain the slave data during the power collapse.

28. The integrated circuit of claim 27, wherein the power management circuitry is further configured to undergo the power collapse and to produce the combined control signal during the power collapse.

29. The integrated circuit of claim 27, wherein:
the first flip-flop includes isolation circuitry configured to isolate the master portion of the first flip-flop from the slave portion of the first flip-flop during the power collapse responsive to the combined control signal; and
the second flip-flop includes isolation circuitry configured to isolate the master portion of the second flip-flop from the slave portion of the second flip-flop during the power collapse responsive to the combined control signal.

* * * * *